United States Patent [19]

French et al.

[11] Patent Number: 5,337,011
[45] Date of Patent: Aug. 9, 1994

[54] PRE-AMPLIFIER

[75] Inventors: John S. French, Arlington Heights; Richard W. Peters, Algonquin, both of Ill.

[73] Assignee: Knowles Electronics, Inc., Itasca, Ill.

[21] Appl. No.: 989,714

[22] Filed: Dec. 14, 1992

[51] Int. Cl.$^5$ .............................................. H03F 3/45
[52] U.S. Cl. ...................................... 330/258; 330/156; 330/300; 330/311; 381/120
[58] Field of Search ................ 330/149, 156, 253, 258, 330/300, 311; 381/120, 121

[56] References Cited

U.S. PATENT DOCUMENTS

| | | | |
|---|---|---|---|
| 3,660,772 | 5/1972 | Holt | 330/253 |
| 3,801,933 | 4/1974 | Teare | 330/35 |
| 3,927,383 | 12/1975 | Fjarlie et al. | 330/59 |
| 4,063,050 | 12/1977 | Carlson et al. | 179/111 |
| 4,151,480 | 4/1979 | Carlson et al. | 330/277 |
| 5,083,095 | 1/1992 | Madaffari | 330/277 |

*Primary Examiner*—James B. Mullins
*Attorney, Agent, or Firm*—Dorn, McEachran, Jambor & Keating

[57] ABSTRACT

A tiny pre-amplifier for a small, low voltage, high impedance signal source, usually an electret microphone, exhibiting near unity gain, has an input cascode stage connected to the microphone and a matched balancing cascode stage; both cascode stages are energized from the same power supply circuit. The two cascode stages supply intermediate signals to the inputs of a differential amplifier to generate an output signal having a greatly reduced noise content, independent of power supply variations. The pre-amplifier is wholly integratable, has low power drain, and fits into the microphone housing.

11 Claims, 3 Drawing Sheets

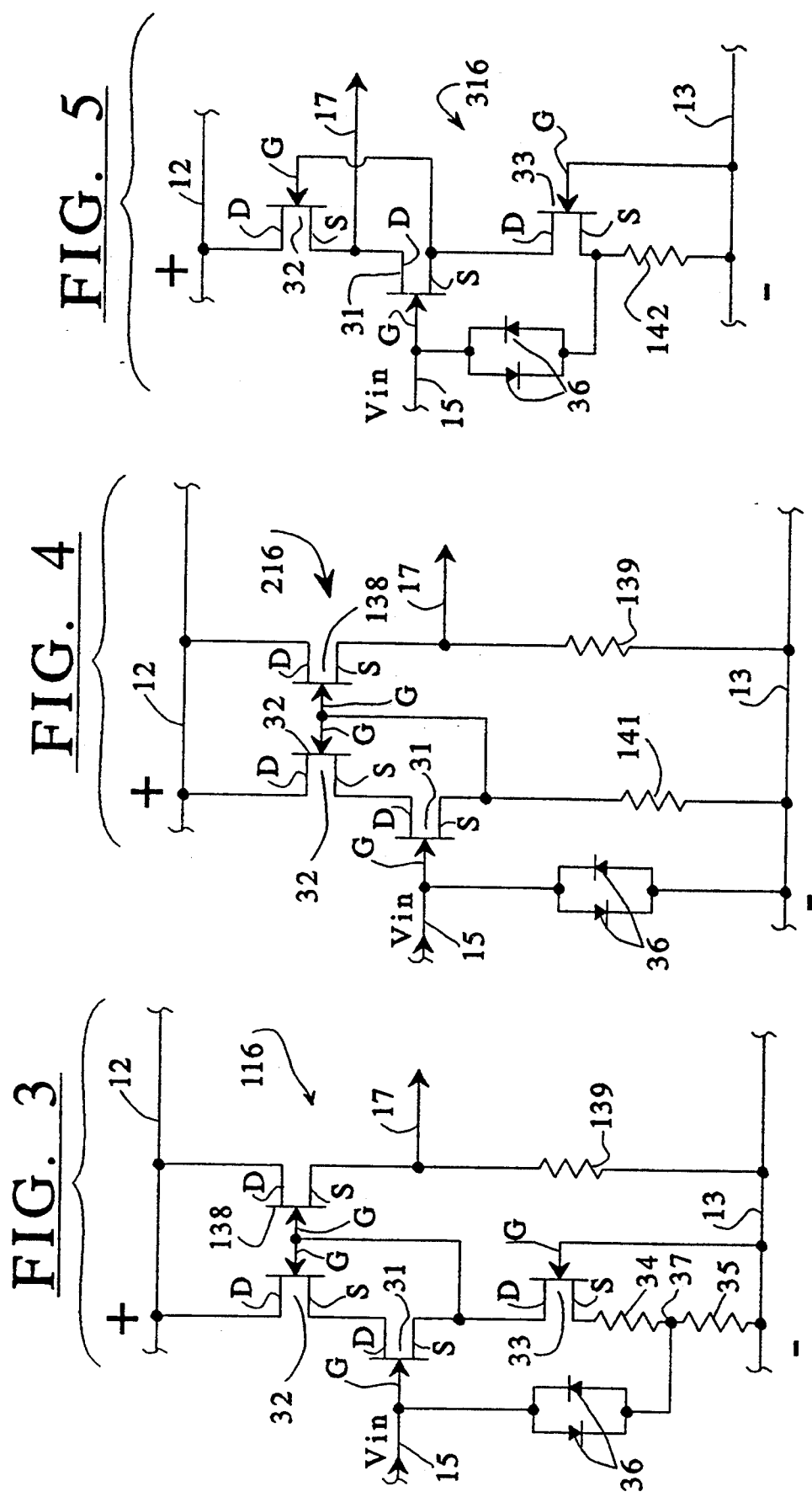

PRE-AMPLIFIER

BACKGROUND OF THE INVENTION

In amplifying low level signals from a high impedance source such as an electret microphone, the first or pre-amplifier stage of an amplifier may attenuate the incoming signal substantially because of a poor impedance match, may generate excessive noise, and may cause feedback oscillation. Various techniques have been proposed to circumvent these problems, but some of those techniques are difficult to implement, especially in applications that use a low supply voltage, such as the single 1.3 volt power cell usually used in a hearing aid.

A pre-amplifier for a signal from a high source impedance, such as an electret microphone, should have a relatively high input impedance if diminution of the signal is to be avoided. The reason for this is the voltage division that occurs between the signal's source impedance and the input impedance of the amplifier.

Another problem with high source impedances, complicated if a low power supply voltage is used, is noise and other undesirable signals introduced via the power supply conductors. The immediate source of the problem may be a resistance in the power supply or the internal impedance of the power source. This effect is especially troublesome when a power cell nears the end of its life. Unwanted power supply signals can be of various types. Stray pickup of power line hum or of a radio station may occur. The power supply may contribute a signal that, because of high current drawn through the power supply impedance, is equal to or greater than the wanted signal. The circuit may then go into feedback oscillation.

One amplifier that successfully solves some of these problems is disclosed in-Madaffari U.S. Pat. No. 5,083,095 issued Jan. 21, 1992. That amplifier affords improved input impedance and reduced susceptibility to power supply fluctuations, as compared with some prior circuits. But the input amplifiers of that patent still have some problems, particularly as regards noise content in the output signal supplied to succeeding amplifiers. The present invention is aimed at solving those problems.

SUMMARY OF THE INVENTION

It is a principal object of the invention, therefore, to provide a new and improved pre-amplifier, for applications using a low voltage power supply with an electret microphone or other high impedance input signal source, that provides an improved impedance match, avoids undue loss of gain, and suppresses noise and other extraneous signals more effectively than previous amplifiers.

A more specific object of the invention is to provide a new and improved pre-amplifier, for a hearing aid or other similar applications, that is tiny in size, fully integratable, simple and inexpensive in construction, yet highly reliable and effective in operation.

Accordingly, the invention relates to a pre-amplifier for a small, low voltage, high impedance input signal source such as an electret microphone, adapted to use in a hearing aid or other application which requires minimal size, low noise, minimal power demand, and substantial independence from power supply variations. The pre-amplifier circuit comprises first and second D.C. power supply conductors of opposed relative polarity, an input cascode stage comprising first and second field-effect transistors (FETs) interconnected with each other in a cascode amplifier circuit with the drain-source conduction path of the second FET connecting the drain electrode of the first FET to the first power supply conductor and the source electrode of the first FET connected to the gate of the second FET, and input connection means for applying an A.C. input signal from a high impedance source to the gate electrode of the first FET in the input cascode stage. The input cascode stage further comprises a bias current circuit for the first FET, the bias current circuit including two small diodes connected in parallel with each other, in opposed polarities, between the gate electrode of the first FET and the second power supply conductor, and a bias resistance connected from the source electrode of the first FET to the second power supply conductor. First connection means are provided for deriving a first intermediate A.C. signal from the input cascode stage. There is a balancing cascode stage, comprising first and second field-effect transistors (FETs) and bias current circuit means connected across the power supply conductors in a cascode amplifier circuit matched to the input cascode stage, with second connection means for deriving a second intermediate A.C. signal from the balancing cascode stage. A differential amplifier stage has first and second inputs respectively connected to the first and second connection means; the differential amplifier develops an A.C. pre-amplifier output signal representative of the differential between the first and second intermediate A.C. signals.

BRIEF DESCRIPTION OF THE DRAWINGS

FIGS. 3, 4 and 5 each illustrate a cascode amplifier circuit that may be utilized in place of the cascode amplifiers shown in FIG. 2.

DESCRIPTION OF THE PREFERRED EMBODIMENTS

Figure 1:
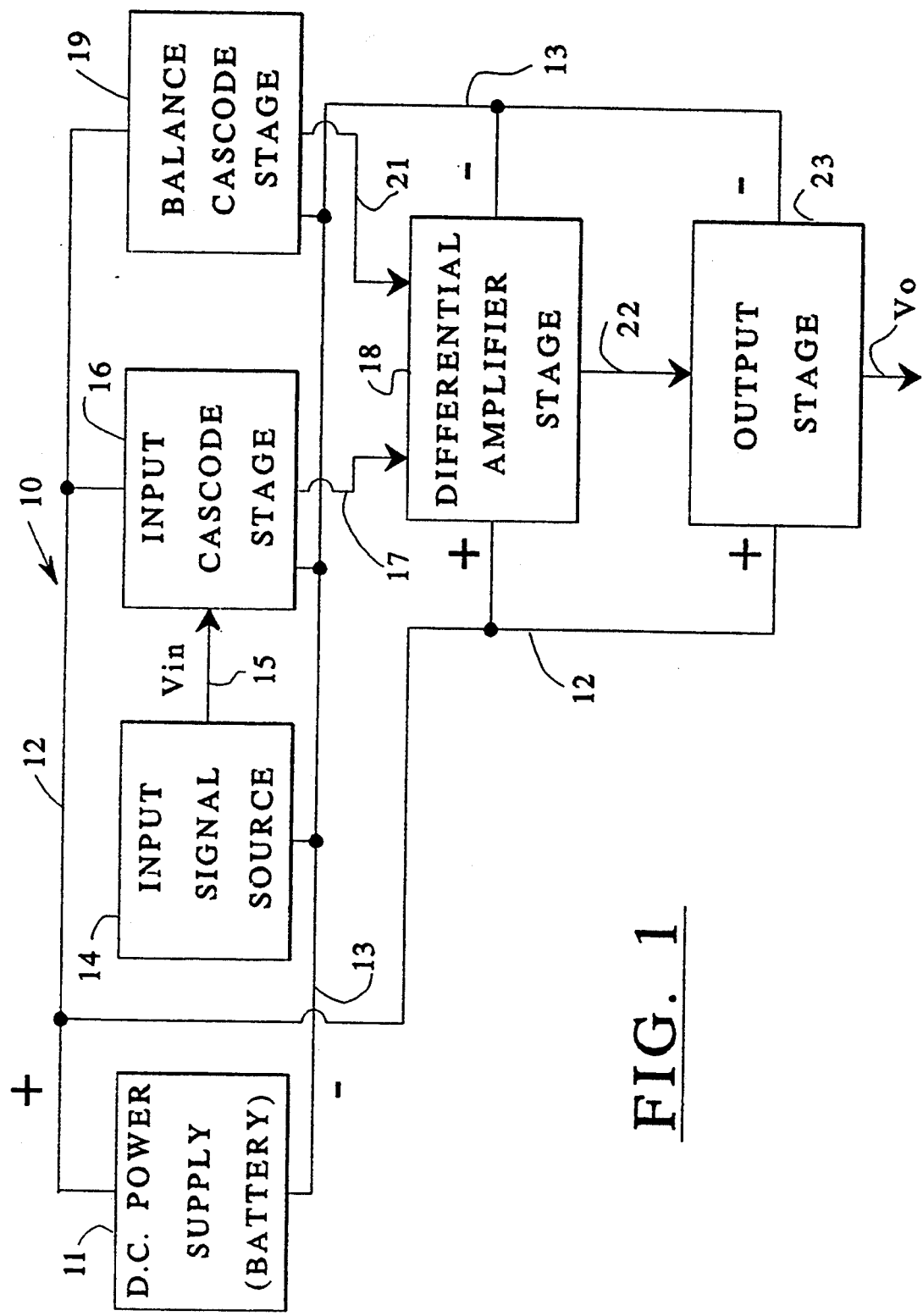
FIG. 1 is a block diagram of a pre-amplifier circuit constructed in accordance with the invention.

FIG. 1 affords a block diagram of a pre-amplifier 10, constructed in accordance with the invention. Pre-amplifier 10 is suitable for use with a small, low voltage, high impedance input signal source such as an electret microphone. Pre-amplifier 10 is thus well adapted to use in hearing aids or in other applications which require minimal size, low noise, minimal power demand, and substantial independence from power supply variations.

Pre-amplifier 10, FIG. 1, includes a D.C. power supply 11; in a hearing aid power supply 11 is usually a tiny one cell battery. Power supply 11 is shown connected to first and second D.C. power supply conductors 12 and 13. Conductor 12 is connected to the positive pole of the battery or other power supply and conductor 13 is the negative conductor. It should be understood that these are relative polarities, usually positive and negative as indicated, and that one of them may constitute a ground conductor for circuit 10. However, the two power supply conductors 12 and 13 could have the same polarity with respect to some reference (e.g. an earth ground) but with a predetermined D.C. differential between them. For example, conductor 12 could actually be at plus ten volts D.C. relative to ground and conductor 13 at plus five volts so that there is a D.C.

differential between the two conductors of five volts and the relative polarities between the two are as shown. In a hearing aid, the actual voltage differential is customarily somewhat smaller, of the order of two volts or less.

An input signal source 14 is shown in FIG. 1. Signal source 14 is a high impedance, low voltage device such as an electret microphone. It includes an appropriate connection to power supply 11, in this instance a connection to the negative D.C. conductor 13. Pre-amplifier 10 further includes input connection means 15 for applying an A.C. input signal from source 14 to an input cascode amplifier stage 16 that has appropriate power supply connections to conductors 12 and 13. The input cascode stage 16 has a first output connection means, shown as output conductor 17, for supplying a first intermediate A.C. signal from the input cascode stage 16 to one input of a differential amplifier 18.

The pre-amplifier 10 of FIG. 1 further comprises a balancing cascode amplifier stage 19 that has appropriate power supply connections to the conductors 12 and 13. This balancing cascode stage 19 is matched to the input cascode stage 16 and has a second output connection means, shown as a conductor 21, for supplying a second intermediate A.C. signal from stage 19 to the differential amplifier 18. The differential amplifier 18 has appropriate power supply connections from conductors 12 and 13. The output 22 from differential amplifier 18, which constitutes a third A.C. signal representative of the differential between the first and second signals supplied to amplifier 18 through its inputs 17 and 21, may be supplied to later amplifier stages in the hearing aid or other circuit application through an output stage 23.

The basic operation of amplifier circuit 10 can be considered on the basis of the block diagram illustration of FIG. 1, though achievement of some of the objectives of the invention can best be understood by consideration of the specific circuits of FIGS. 2–5. Thus, referring to FIG. 1, the input signal source 14 generates an A.C. input signal Vin which is applied, by the input connection means 15, to the input cascode amplifier stage 16. This input signal Vin includes noise components generated in source 14 and other extraneous components due to noise on the power supply conductors 12 and 13 and to fluctuations in the D.C. power supply voltage from supply 11. The balancing cascode amplifier stage 19, on the other hand, develops an A.C. output signal representative of noise and voltage variations on the power supply conductors 12 and 13. The two cascode stages 16 and 19 should be matched to each other, so that the second intermediate A.C. signal on line 21 from stage 19 to the differential amplifier 18 is essentially the same as the components of the first intermediate A.C. signal on connector 17, developed in stage 16, that result from noise and voltage variations on the power supply conductors 12 and 13.

The differential amplifier stage 18 performs much the same function as a "humbucker" in some electromagnetic devices; in effect, it utilizes the second signal input from conductor 21 to cancel the corresponding components of the more complex input from connection 17. As a consequence, the A.C. signal on line 22 from stage 18 includes little or no contribution based on noise, voltage variations, and other A.C. components that are common to the two cascode stages 16 and 19. That is, the A.C. signal from differential amplifier 18, on line 22, represents, in essence, the output from signal source 14, with power supply noise and voltage variations, and other undesirable fluctuations eliminated. The overall gain of circuit 10 is slightly less than unity. The principal effect of pre-amplifier 10 is to function as an impedance transformer, so that the output Vo to succeeding stages (not shown) appears to emanate from a source of relatively low impedance instead of from the high impedance initial source 14.

Figure 2:
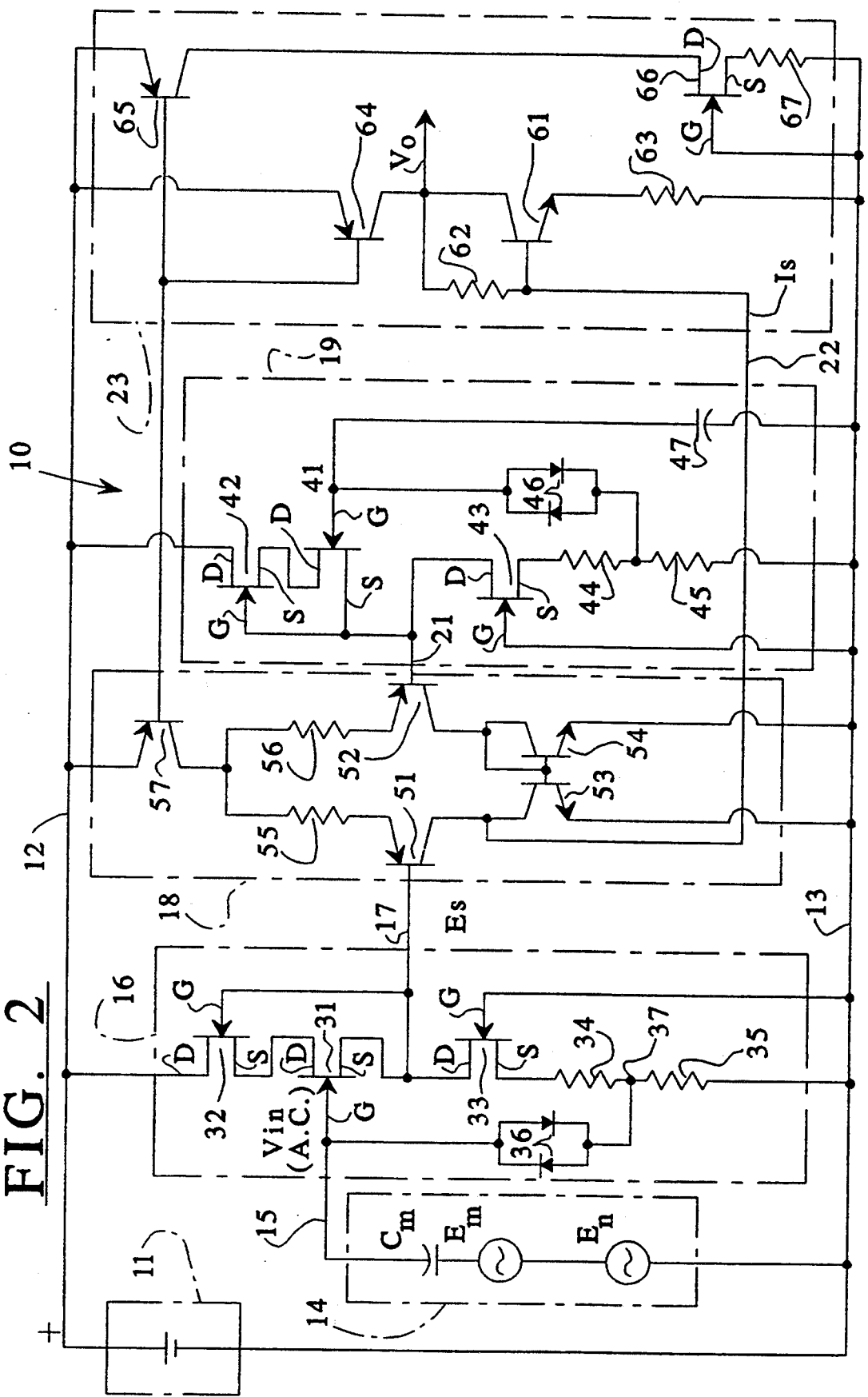
FIG. 2 is a detailed diagram of a pre-amplifier circuit that implements the block diagram of FIG. 1.

FIG. 2 illustrates one specific circuit that can be utilized to implement the pre-amplifier 10 shown in block diagram form in FIG. 1, particularly in a hearing aid. As shown in FIG. 2, power supply 11 may comprise a simple one-cell battery having its positive terminal connected to the first D.C. conductor 12 and its negative terminal connected to the second D.C. conductor 13. The input signal source 14 constitutes an electret microphone having a capacitance Cm. Two signal generators Em and En are shown in FIG. 2 as constituting a part of the input signal source 14. Generator Em represents the portion of the electret microphone that generates a sound-induced signal. Generator En is intended to represent the portion of the electret microphone that produces noise signals, at a substantially lower amplitude than the output from the signal-induced generator portion Em of the microphone. All of these components of microphone 14 (Cm, Em and En) contribute to the content of the A.C. input signal Vin applied by the input connection means 15 to the gate electrode of a first field effect transistor 31 incorporated in the input cascode amplifier stage 16 of pre-amplifier 10.

The input cascode stage 16 of pre-amplifier 10, FIG. 2, further comprises a second FET 32, and a third FET 33 that is a part of a bias current circuit for the first FET 31. The drain electrode of the first FET 31 is connected to the source electrode of the second FET 32 and the drain electrode of FET 32 is connected to the first D.C. power supply conductor 12. The FET 33, on the other hand, has its drain electrode connected to the source of the first FET 31 and its source electrode returned to the negative polarity power supply conductor 13 through the series combination of two resistors 34 and 35. It should be understood that "drain" and "source" electrodes of the FETs may be interchanged, as desired by the circuit designer, due to the similarity of operational characteristics.

A bias circuit including two diodes 36 connected in parallel with each other in opposed polarities is connected from the common terminal 37 of resistors 34 and 35 back to the input connection conductor 15 and, accordingly, to the gate of FET 31. The gate of FET 33 is connected directly to the second, negative D.C. power supply conductor 13. The common connection between electrodes of the first and third FETs 31 and 33 is connected to the gate of the second FET 32 and is also connected to the conductor 17 used to supply a first intermediate A.C. signal from the input cascode stage 16 to differential amplifier 18.

The balancing cascode amplifier stage 19 shown in the specific circuit of FIG. 2 is matched to the input cascode stage 16. Thus, stage 19 includes first, second and third field-effect transistors 41, 42 and 43, two series resistors 44 and 45, and a dual-diode bias circuit 46, all connected together in the same manner as the previously described components 31–36. In this instance the output connection 21 from the cascode stage is taken from the interconnection between the source electrodes of the first and third FETs 41 and 43 and the gate electrode of the second FET 42. The one difference between stages 16 and 19 is that there is no external A.C. input, like devices 14 and 15, for stage 19. However, there is a capacitor 47 connected from the gate of the first FET 41 to the negative power supply conductor 13.

In the specific circuit for pre-amplifier 10 shown in FIG. 2, differential amplifier 18 comprises two PNP transistors 51 and 52 and two NPN transistors 53 and 54. The collector of transistor 51 is connected to the collector of transistor 53. The bases of the two transistors 53 and 54 are connected to each other. The collector of transistor 52 is connected to the collector of transistor 54 and is also connected to the bases of transistors 53 and 54. The emitters of transistors 53 and 54 are both connected to the negative D.C. power conductor 13. The emitter of transistor 51 is connected to a resistor 55 and the emitter of transistor 52 is connected to a resistor 56. The two resistors 55 and 56 are connected to the collector of an additional PNP transistor 57 that has its emitter connected to the positive polarity supply conductor 12.

The output stage 23 illustrated in FIG. 2 includes an NPN transistor 61 having its base connected to the collectors of transistors 51 and 53 in differential amplifier 18 by the output connection means comprising conductor 22. The base of transistor 61 is connected to a feedback resistor 62 that is connected to the collector of the transistor. The emitter of transistor 61 is connected to a resistor 63 that is returned to the negative D.C. supply conductor 13.

In output stage 23, as shown in FIG. 2, there is a PNP transistor 64 having its emitter connected to power supply conductor 12 and its base connected to the base of transistor 57 in the differential amplifier 18. The collector of transistor 64 is connected to the collector of transistor 61. The output Vo for stage 23 is taken from the common terminal of the collectors of transistors 61 and 64. Output stage 23, FIG. 2, further comprises a PNP transistor 65 and a field effect transistor 66. The emitter of transistor 65 is connected to the positive polarity supply conductor 12. The base is connected to the base electrodes of transistors 57 and 64. The collector of transistor 65 is connected to the source electrode of an FET 66. The drain of FET 66 is connected to a resistor 67 that is returned to the negative power supply conductor 13. The gate of FET 66 is connected to conductor 13.

The pre-amplifier circuit 10, FIG. 2, meets the basic objectives and requirements of the invention; it is particularly valuable and useful as an input stage in a hearing aid. The noise En generated in the electret microphone (En), which appearing as a part of the A.C. signal Vin on the input connection 15 to cascode amplifier 16, is typically about 30 nv/$\sqrt{Hz}$ in the audio frequency band. There is an additional amplifier noise contribution, typically about 18 nv/$\sqrt{Hz}$, principally from FETs 31-33 and transistors 51-54. Noise due to FETs 42-44 is effectively minimized by capacitor 47; it is relatively negligible.

The input impedance of amplifier 10 is increased substantially by the "bootstrap" action of FET 32, so that the gate-to-drain capacitance of FET 31 is effectively neutralized. Accordingly, there is a good match with the high impedance input signal source, electret microphone 14. Moreover, the high impedance load of FET 33 and transistor 51 on the source of FET 31 enable near-unity gain from gate to source of FET 31. The minimal gate current of FET 31 makes it possible to use small diodes for the bias diodes 36, adding only minimal capacitance at the input to cascode amplifier 16. Thus, the inherent microphone capacitance Cm is substantially unloaded by the overall input capacitance of FET 31.

Noise and voltage variations for the power supply, battery 11, and conductors 12 and 13, are substantially eliminated by the use of FET 32, by the replication of the input cascode amplifier 16 in the second cascode stage 19 (FETs 41—43, etc.), and by use of the differential amplifier 18, particularly transistors 51 and 52. With the cascode FETs 32 and 42 biased to operate in a constant current mode, modulation of current in the two cascode amplifier chains (FETs 31—33 and 41—43) is effectively precluded, thereby preventing voltage modulation at the source of the input FET 31 (and FET 41). Furthermore, the nearly identical residual modulations at the sources of FETs 31 and 41 are effectively cancelled (rejected) in differential amplifier 18.

The gain of pre-amplifier 10 is composed of three parts. First, the gain of FET 31 is near unity, while the differential amplifier 18 (transistors 51-54) converts the input signal voltage Es on line 17 to a current Is on line 22 by the factor $$\frac{Es}{Is} = \frac{2}{Re62 + Re63 + R55 + R66},\qquad(1)$$

where R55 is the value of resistor 55, R56 is resistor 56, $$Re62 = \frac{26 \times 10^{-3}}{Ie62},\qquad(2)$$

and $$Re63 = \frac{26 \times 10^{-3}}{Ie63}\qquad(3)$$

The output signal voltage Vo is generated by resistor 62 and transistor 61 and can be expressed as:

$$Vo = Is\,(R62)\qquad(4)$$

Accordingly, the gain G of pre-amplifier 10 is $$G = \frac{Vo}{Es} = \frac{R62}{Re62},\qquad(5)$$

where Re62=Re63; R55=R56<<Re62 and Ie62=Ie63. Because Ie62 and Ie63 are controlled by transistor 57, and the current through transistor 57 is set via transistor 65, FET 66, and resistor 67, the overall gain of pre-amplifier 10 can be conveniently varied by changing the resistance 67.

Pre-amplifier 10 is totally integratable upon a single silicon chip, without the use of external components. The pre-amplifier is D.C. coupled; matching of FETs 31-33 to FETs 41-43, resistors 34 and 35 to resistors 44 and 45, and diodes 36 to diodes 46 enables differential amplifier 18 to cancel temperature and power supply variations effectively while amplifying the desired A.C. signals supplied from microphone 14 via capacitance Cm. The pre-amplifier can be fabricated in less than 0.01 square inches of area and can be mounted in one housing with a subminiature microphone.

The total current required for effective operation of pre-amplifier 10, utilizing a 1.3 volt cell as power supply 11, is about 70 microamperes. As a consequence, the pre-amplifier can be used in a hearing aid, where this current is but a small fraction of the total current required (usually 250 microamperes to four milliamperes). The bias arrangement for FETs 31 and 33 in the input cascode amplifier 16, comprising diodes 36 and resistors 34 and 35, duplicated in the balancing cascode amplifier 19 by diodes 46 and resistors 44 and 45, enables operation of devices 31 and 41 at near-unity gain while allowing adequate bias current for low noise and ample linear signal swing of the A.C. signal without appreciable distortion. More particularly, the small diode biasing circuit comprising diodes 36 provides a high impedance (low noise current) bias from terminal 37 that raises the gate voltage of FET 31 enough to enable FET 33 to act as a high dynamic impedance.

FIG. 3 illustrates an input cascode stage 116 that may be utilized in place of the input stage 16 of FIGS. 1 and 2. Much of the circuit is the same as previously described. Thus, there is an input field-effect transistor (FET) 31 having its gate electrode connected to the input conductor 15. A second FET 32 has its source connected to the drain of FET 31 and its drain connected to power supply conductor 12. The gate of FET 32 is connected to the source of FET 31 and to the drain of the third FET 33. As before, the source of FET 33 is returned to the power supply conductor through the series combination of resistors 34 and 35. The bias circuit again comprises two small diodes 36 connected in parallel with each other and in opposed polarity, connected from conductor 15 to the common terminal 37 of resistors 34 and 35.

Cascode amplifier stage 116, however, includes an additional field-effect transistor 138 having its gate connected to the gate of FET 32 and to the source of FET 31. The drain of FET 138 is connected directly to the positive polarity power supply conductor 12. The source of this additional FET is returned to the negative power supply conductor 13 through a resistor 139. The output signal connection 17 to the differential amplifier stage 18 (see FIG. 1) is taken from the drain of FET 138.

A comparison of cascode circuit 116 of FIG. 3 with cascode stage 16 in FIG. 2 makes it clear that the two are of the same construction except for the additional FET 138. In each, the input is applied to FET 31 which, with FET 32, forms the input of the cascode amplifier. Stated differently, FET 31 is the input transistor and FET 32 is the cascoded device, connected to the drain of the input transistor. In each, transistor 33 forms a part of a current source to bias the input stage; the oppositely connected diodes 36 and voltage divider 34, 35 are a part of that current source.

In cascode amplifier 16, FIG. 2, the output connection 17 is taken directly from the connection of the drain of FET 31 to the gate of FET 32. There is no output transistor in the cascode circuit. In the cascode circuit 116 of FIG. 3, however, the additional FET 138 functions as an output stage. The output connection 17 to the differential amplifier (see FIG. 1) is taken from the connection between load resistor 139 and the source of transistor 138. Otherwise, the two circuits function in a similar manner. Of course, where cascode circuit 116 is to be incorporated in pre-amplifier circuit 10 (FIG. 2) the same circuit should be used for the balancing cascode stage.

The cascode amplifier 216 illustrated in FIG. 4 retains the output stage comprising FET 138 and resistor 139, connected into the circuit in the same manner as those elements are in FIG. 3. In circuit 216, however, the bias current source formed by transistor 33 and voltage divider 34, 35 is replaced by a single resistor 141. The portion of the previously described bias current circuit comprising the two oppositely polarized parallel connected small diodes 36 is now connected from the input conductor 15 to the negative power supply conductor 13.

Yet another cascode circuit 316 usable in the invention is illustrated in FIG. 5. It includes the input transistor 31, the cascoded transistor 32, and the bias current source transistor 33; these three FETs are connected together in essentially the same manner as in the circuits of FIGS. 2 and 3. In this instance, however, the voltage divider comprising resistors 34 and 35 that is used in the previously described circuits is replaced by a single resistor 142 and the parallel opposed polarity diodes 36 are connected directly to the source of the bias transistor, FET 33. Moreover, in cascode circuit 316 the output stage employed in FIGS. 3 and 4 is eliminated; the output connection 17 is taken directly from the drain electrode of transistor 31. In a pre-amplifier circuit that uses the cascode stage 316, instead of the input cascode stage 16 described in FIG. 2, the balancing cascode stage should be replaced by an essential duplicate of the input cascode stage. This applies also to cascode amplifier 216 of FIG. 4.

In all versions of the present invention, noise generated by the pre-amplifier circuit does not add substantially to the noise generated by the high impedance source such as electret microphone 14. To aid in meeting this requirement, and partly to reduce the required amplifier gain, the input impedance of the pre-amplifier does not substantially load the microphone signal and hence does not materially reduce it. The pre-amplifier effectively rejects power supply noise and is essentially immune to variations in the output voltage from the power supply (e.g. battery 11, FIG. 2). The pre-amplifier has a high enough gain (gain is nearly unity) so that noise created in following amplifier stages in a hearing aid or similar application is relatively unimportant. Of substantial importance, the pre-amplifier is very small in size and can be fully integrated into a single, unitary silicon circuit with no need for external components of any significance or substantial size, facilitating inclusion of the pre-amplifier into a housing with a miniature microphone such as an electret. Finally, the power supply current required to activate the pre-amplifier is held to a minimum.

Throughout the foregoing specification, and in the appended claims, any reference to a field-effect transistor or FET includes a junction field-effect transistor or JFET. As previously noted, because the drain and source electrodes of an FET are generally similar, they may be considered interchangeable in at least some versions of the pre-amplifier of the invention.

Because the pre-amplifier can be integrated into a unitary silicon chip, it is difficult to provide parameters for the transistors in a specific example of the device, based on FIG. 2. Workable parameters may be as follows; it will be understood that substantial variation can be tolerated.

| Component | Parameter(s) |
| --- | --- |
| Battery 11 | 1.3 volt cell |
| Electret microphone 14 | 0.1–10 picofarads |
| Resistances 34, 44 | 1–10 kilohm |

-continued

| Component | Parameter(s) |
| --- | --- |
| Resistances 35, 45 | 1–10 kilohm |
| Resistances 55, 56 | 500 ohms–5 kilohms |
| Capacitance 47 | 5–50 picofarads |
| Resistance 62 | 10–100 kilohm |
| Resistance 63 | 0–10 kilohm |
| Resistance 67 | 1–50 kilohm |

We claim:

1. A pre-amplifier for a small, low voltage, high impedance input signal source such as an electret microphone, adapted to use in a hearing aid or other application which requires minimal size, low noise, minimal power demand, and substantial independence from power supply variations, the pre-amplifier circuit comprising:

first and second D.C. power supply conductors of opposed relative polarity;

an input cascode stage comprising first and second field-effect transistors (FETs) interconnected with each other in a cascode amplifier circuit with the drain-source conduction path of the second FET connecting the drain electrode of the first FET to the first power supply conductor and the source electrode of the first FET connected to the gate of the second FET;

input connection means for applying an A.C. input signal from a high impedance source to the gate electrode of the first FET in the input cascode stage;

the input cascode stage further comprising a bias current circuit for the first FET, the bias current circuit including two small diodes connected in parallel with each other, in opposed polarities, between the gate electrode of the first FET and the second power supply conductor, and a bias resistance connected from the source electrode of the first FET to the second power supply conductor;

first connection means for deriving a first intermediate A.C. signal from the input cascode stage;

a balancing cascode stage, comprising first and second field-effect transistors (FETs) and bias current circuit means connected across the power supply conductors in a cascode amplifier circuit matched to the input cascode stage;

second connection means for deriving a second intermediate A.C. signal from the balancing cascode stage;

and a differential amplifier stage having first and second inputs respectively connected to the first and second connection means, for developing an A.C. pre-amplifier output signal representative of the differential between the first and second intermediate A.C. signals.

2. A pre-amplifier for a small, low voltage, high impedance signal source, according to claim 1, in which each cascode stage further comprises a third FET as a part of the bias current circuit, the third FET having its drain electrode connected to the source electrode of the first FET and having its source electrode connected to the second power supply conductor through the bias resistance.

3. A pre-amplifier for a small, low voltage, high impedance signal source, according to claim 2, in which the two parallel diodes are connected to the second power supply through at least a part of the bias resistance.

4. A pre-amplifier for a small, low voltage, high impedance signal source, according to claim 3, in which the bias resistance comprises two series-connected resistors affording a voltage divider with a common terminal between the two resistors, and in which the two parallel diodes are connected to that common terminal.

5. A pre-amplifier for a small, low voltage, high impedance signal source, according to claim 1, in which the first connection means comprises a connection to the gate electrode of the second FET.

6. A pre-amplifier for a small, low voltage, high impedance signal source, according to claim 5, and in which the connection means for each cascode stage further comprises:

a connection FET having its gate electrode connected to the gate electrode of the second FET in the cascode stage, the connection FET having its drain and source electrodes connected to the first and second power supply conductors, respectively.

7. A pre-amplifier for a small, low voltage, high impedance signal source, according to claim 6, in which a load resistance is connected from the source electrode of the connection FET to the second power supply conductor and the first A.C. output signal is taken from the connection between the load resistance and the source electrode of the connection FET.

8. A pre-amplifier for a small, low voltage, high impedance signal source, according to claim 1, in which the first connection means comprises a connection to the drain of the first FET.

9. A pre-amplifier for a small, low voltage, high impedance signal source, according to claim 1, and further comprising:

an output stage, having an input for receiving the pre-amplifier output signal, the output stage determining the overall gain of the pre-amplifier.

10. A pre-amplifier for a small, low voltage, high impedance signal source, according to claim 1, in which the balancing cascode stage further comprises a capacitance connected from one power supply conductor to the gate electrode of the first FET in that stage.

11. A pre-amplifier for a small, low voltage, high impedance signal source, according to claim 10, in which the one power supply conductor to which the capacitance is connected is the second power supply conductor.

* * * * *